United States Patent [19]
Utsumi et al.
[11] Patent Number: 4,756,808
[45] Date of Patent: Jul. 12, 1988

[54] PIEZOELECTRIC TRANSDUCER AND PROCESS FOR PREPARATION THEREOF

[75] Inventors: Kazuaki Utsumi; Takeshi Inoue; Sadayuki Takahashi, all of Tokyo, Japan
[73] Assignee: NEC Corporation, Tokyo, Japan

[21] Appl. No.: 869,633
[22] Filed: Jun. 2, 1986
[30] Foreign Application Priority Data
May 31, 1985 [JP] Japan ................................ 60-117882
Jun. 4, 1985 [JP] Japan ................................ 60-121037
Jun. 4, 1985 [JP] Japan ................................ 60-121039
[51] Int. Cl.[4] ...................... C25D 13/00; C25D 13/02; C25D 13/04; H01L 41/04
[52] U.S. Cl. .............................. 204/180.2; 204/180.9; 204/181.1; 204/192.1; 310/320; 310/321; 310/322; 310/325; 310/334; 427/124; 427/125
[58] Field of Search ............... 29/25.35; 310/320, 321, 310/322, 323, 325, 326, 327, 334; 204/180.2, 180.9, 181.1, 181.4, 181.6, 181.7, 192 R; 427/124, 125

[56] References Cited
U.S. PATENT DOCUMENTS

| | | | |
|---|---|---|---|
| 3,864,161 | 2/1975 | Thompson | 29/25.35 |
| 4,211,948 | 7/1980 | Smith et al. | 310/326 |
| 4,419,467 | 12/1983 | Wismer et al. | 204/181.7 |
| 4,523,122 | 6/1985 | Tone et al. | 310/327 |
| 4,616,152 | 10/1986 | Saito et al. | 310/334 |

*Primary Examiner*—John F. Niebling
*Assistant Examiner*—Ben C. Hsing
*Attorney, Agent, or Firm*—Sughrue, Mion, Zinn, Macpeak & Seas

[57] ABSTRACT

A piezoelelectric transducer usable preferably as a high-frequency ultrasonic probe for diagnostic inspection and the process for preparation thereof are disclosed.

The piezoelectric transducer comprises a piezoelectric material layer, a pair of electrode layers formed respectively on the opposite surfaces of said piezoelectric material layer and for applying electric load across the piezoelectric material layer to thereby generate acoustic oscillation or for measuring electric energy generated due to the acoustic oscillation of the piezoelectric material layer, and an acoustic matching section containing at least one quarter-wave matching layer and formed on one of the electrode layers. The acoustic matching section includes an elelctric conductive layer therein.

The acoustic matching section is formed by electro deposition, preferably by the electro painting method or electrophoretic method.

The ultrasonic probe can be prepared of a frequency band higher than 7.5 MHz, even higher than 10 MHz and provides a clear image of a shallow portion from the surface of an object to be inspected such as a human body.

29 Claims, 6 Drawing Sheets

PIEZOELECTRIC TRANSDUCER AND PROCESS FOR PREPARATION THEREOF

BACKGROUND OF THE INVENTION

1. Field of the Invention

The present invention relates to a piezoelectric transducer and the process for preparation thereof. More particularly, the present invention relates to a piezoelectric transducer usable preferably as an ultrasonic probe for diagnostic inspection which is conducted at a frequency band higher than 10 MHz and provides a clear image of a shallow portion from the surface of an object to be inspected, and the process for preparation thereof.

2. Description of the Related Art

The piezoelectric transducer is widely used as an ultrasonic probe for the intact diagnostic inspection of the abdomen and the chest of the human body. Such an intact diagnostic inspection is conducted by applying the ultransonic probe directly to the skin surface of the portion to be inspected to thereby enable a dynamic observation of the soft tissue structure of the portion.

Recently, there has been an increasing demand for an ultrasonic probe which can be swallowed into the stomach in order to obtain a clear image of the mucous membrane of the stomach wall. For this sake, the ultrasonic probe should present a high central frequency, usually higher than 7.5 MHz.

Generally the ultrasonic wave presents a larger propagation loss with higher frequency. Thus, the ultrasonic probe of a high frequency is not suitable for the diagnostic inspection of a deep portion of the human body. In the ultransonic probe, however, the resolution power is enhanced with a higher frequency so that the high-frequency ultrasonic probe can be preferably used for the dynamic inspection of a shallow portion such as the stomach wall. Accordingly, there have been developed ultrasonic probes having a higher frequency for obtaining correct and minute diagnostic information.

FIG. 1 is a perspective view showing a piezoelectric transducer of the prior art used as an ultrasonic probe for diagnostic inspection.

The ultrasonic probe shown in FIG. 1 includes a piezoelectric ceramic element 10 for electro-mechanical enery transduction. The piezoelectric ceramic element 10 is polarized in the thickness direction P as shown by an arrow in FIG. 1 by applying a high electric voltage thereacross. The piezoelectric ceramic element 10 is to generate and receive an ultrasonic oscillation. For this sake, a pair of electrode layers 14 and 15 are formed on the opposite surfaces of the piezoelectric ceramic element 10.

The ultrasonic probe shown in FIG. 1 further includes an acoustic matching section for acousticly matching the probe with the acoustic load (the object to be inspected), whereby making the probe to have a broad bandwidth and a low loss. The acoustic matching section, which is formed for broad-band matching with high efficiency between the piezoelectric ceramic element with relatively high acoustic impedance and a relatively low impedance acoustic load, is composed of two quarter-wave layers 11 and 12. The thickness of each quarter-wave layer 11 or 12 should be one quarter of the wavelength at the resonant frequency of the piezoelectric ceramic element 10.

The ultrasonic probe further includes a backing layer 13 for supporting the piezoelectric ceramic element 10 and absorbing the acoustic oscillation which propagates to the rear portion of the probe. The backing layer 13 should be designed to absorb as little power as possible and to maintain the passband characteristics.

In order to obtain excellent pulse-propagation characteristics with a broad bandwidth, low loss and low ripple, the quarter-wave layers 11 and 12 present respectively an acoustic impedance density (which is defined by the product of density and sonic velocity) of $8.0\times10^6$ to $10.0\times10^6$ Kg/m$^2$.sec. and $2.0\times10^6$ to $3.0\times10^6$ Kg/m$^2$.sec. For this sake, the quarter-wave layer 11 is conventionally made of a material such as silicate glass, chalcogenide glass and epoxy resin mixed with glass powder, and the quarter-wave layer 12 is made of a material such as epoxy resin and acrylic resin and the like.

In the case of a quarter-wave layer 11 of a glass plate, the glass plate is finely ground to present parallel and flat opposite surfaces and bonded by adhesive to the electrode layer 15. In the case of a quarter-wave layer of a resin or a resin mixed with an appropriate amount of fine glass powder, the resin is formed to a sheet and then fixed by adhesive to the electrode layer 15 or the quarter-wave layer 11. Alternatively, the quarter-wave layer 12 of resin is directly casted thereon.

When a high-frequency ultrasonic probe is prepared by such a conventional process, however, the quarter-wave layer 11 and 12 should be made with a smaller thickness which is in inverse proportion to the raised central frequency of the probe. In such a case, there has been a problem that the provision of the adhesive layer between the electrode layer 15 and the quarter-wave layer 11 and the quarter-wave layers 11 and 12 adversely affects the acoustic characteristics of the resulting ultrasonic probe.

Further, in the case of a quarter-wave layer of an organic resin mixed with glass powder or a quarter-wave layer made of an organic resin itself, it is difficult to obtain a resin sheet with a uniform thickness so that ultrasonic probes can hardly be prepared with a constant high performance. Further such a resin sheet tends to readily involve pinholes, resulting in a decrease in the production yield thereof.

Accordingly, with the conventional process, it has been extremely difficult to prepare an ultrasonic probe having quarter-wave layers of a thickness lower than 100 microns with a high and constant production efficiency. Thus, most of the high-frequency ultrasonic probes of the prior art which have been practically used are the single quarter-wave matched type or at most double quarter-wave matched type. It has been impossible to prepare a high-frequency ultrasonic probe with three quarter-wave layers which would exhibit a broader bandwidth.

SUMMARY OF THE INVENTION

It is therefore an object of the present invention to resolve the problems of the prior art explained in the above and to provide a piezoelectric transducer having a broad bandwidth and a low loss.

It is further an object of the present invention to provide a high-frequency ultrasonic probe for diagnostic inspection which provides a clear image of a shallow portion from the surface of an object to be inspected.

It is still further an object of the present invention to provide a process for preparation of a piezoelectric transducer having a broad bandwidth and a low loss.

According to the present invention, there is provided a piezoelectric transducer comprising:

a piezoelectric material layer;

a pair of electrode layers formed respectively on the opposite surfaces of said piezoelectric material layer and for applying electric load across the piezoelectric material layer to thereby generate acoustic oscillation or for measuring electric energy generated due to the acoustic oscillation of the piezoelectric material layer; and an acoustic matching section containing at least one quarter-wave matching layer and formed on one of the electrode layers, said acoustic matching section including an electric conductive layer therein.

According to the present invention, the acoustic matching section is formed by electro deposition. The electro deposition may be conducted by the electro painting method or the electrophoretic method.

According to an embodiment of the present invention, the electric conductive layer is formed in the quarter-wave matching layer.

According to other embodiment of the present invention, the acoustic matching section comprises a plurality of quarter-wave layers, and the electric conductive layer is formed at the interface between the quarter-wave matching layers adjacent to each other.

According to an embodiment of the present invention, each of the quarter-wave layers which are not formed directly on the surface of the electrode layer adjacent to the piezoelectric material layer includes an electric conductive layer therein.

According to a preferred embodiment of the present invention, the acoustic matching section is composed of two quarter-wave layers having respectively an acoustic impedance density of $8.0\times10^6$ to $10.0\times10^6$ kg/m$^2$.sec. and $2.0\times10^6$ to $3.0\times10^6$ kg/m$^2$.sec. The quarter-wave layer having an acoustic impedance density of $8.0\times10^6$ to $10.0\times10^6$ kg/m$^2$.sec. is made of a compound containing a matrix of an organic resin such as acrylic resin, phenolic resin and epoxy resin and an inorganic powder dispersed in the matrix. Such a inorganic powder includes graphite, $TiO_2$, BN, AlN, and $Al_2O_3$.

According to a preferred embodiment of the present invention, the quarter-wave layer having an acoustic impedance density of $2.0\times10^6$ to $3.0\times10^6$ kg/m$^2$.sec. is made of a compound containing a matrix of an organic resin and an inorganic powder dispersed in the matrix.

According to an embodiment of the present invention, the electric conductive layer may be formed by the vapour depositing, sputtering or plating method. The electrode layer may be preferably made of a metal or an alloy containing at least one selected from the group consisting of Al, Ni, Ti, Cr, Cu, Ag and Au.

According to a preferred embodiment of the present invention, the acoustic matching section is composed of three quarter-wave layers having respectively an acoustic impedance density of $10\times10^6$ to $15\times10^6$ kg/m$^2$.sec., $3.0\times10^6$ to $4.5\times10^6$ kg/m$^2$.sec. and $1.7\times10^6$ to $2.1\times10^6$ kg/m$^2$.sec.

The quarter-wave layer having an acoustic impedance density of $10\times10^6$ to $15\times10^6$ kg/m$^2$.sec. is made of a member selected from the group consisting silicate glass, borosilicate glass and chalcogenide glass and formed by the electrophoretic method.

Further, the quarter-wave layer having an acoustic impedance density of $3.0\times10^6$ to $4.5\times10^6$ kg/m$^2$.sec. is made of a compound containing a matrix of an organic resin and an inorganic powder dispersed in the matrix, and the quarter-wave layer having an acoustic impedance density of $1.7\times10^6$ to $2.1\times10^6$ kg/m$^2$.sec. is made of one member selected from the group consisting of urethane resin and epoxy resin. These layers may be preferably formed by the electro painting method.

According to an embodiment of the present invention, the electrode layer may be formed by the burnig, vapour depositing, sputtering or plating method. The electrode layer may be preferably made of a metal or an alloy containing at least one selected from the group consisting of Al, Ni, Ti, Cr, Cu, Ag and Au.

According to the present invention, there is further provided a high-frequency ultrasonic probe for use in diagnostic inspection composed of a piezoelectric transducer, said ultrasonic probe comprising:

a piezoelectric material layer;

a pair of electrode layers formed respectively on the opposite surfaces of said piezoelectric material layer and for applying electric load accross the piezoelectric material layer to thereby generate acoustic oscillation or for measuring electric energy generated due to the acoustic oscillation of the piezoelectric material layer; and an acoustic matching section for acousticly matchig the probe to the portion to be inspected, said acoustic matching section containing at least one quarter-wave matching layer and formed on the electrode layer positioned at the front side of the ultrasonic probe which is directed to the portion to be inspected, said acoustic matching section further including an electric conductive layer therein.

According to the present invention, there is also provided a process for preparation of a piezoelectric transducer comprising the steps of:

forming electrode layers on the opposite surfaces of a piezoelectric material element; and forming an acoustic matching section on one surface of the electrode layer, said acoustic matching layer consisting of at least one quarter-wave layer, said process being characterized in that the acoustic matching section is formed by electro deposition and that an electric conductive layer is formed in the acoustic matching section.

According to a preferred embodiment of the present invention, the quarter-wave layer is formed by the steps of:

forming a first acoustic layer having a thickness smaller than the quarter-wave length at the consonant frequency of the piezoelectric transducer;

forming an electric conductive layer on the surface of the first acoustic matching layer; and forming a second acoustic matching layer having a thickness of the remaining length to the quarter-wave length so that the total thickness of the first and second acoustic matching layers is equal to the quarter-wave length.

According to a still further preferred embodiment of the present invention, the acoustic matching section is formed by the steps of:

forming a quarter-wave layer having an acoustic impedance density;

forming an electric conductive layer on the surface of the quarter-wave layer; and forming on the thus formed electric conductive layer another quarter-wave layer having an acoustic impedance density which is different from that of the first mentioned quarter-wave layer.

DESCRIPTION OF THE PREFERRED EMBODIMENTS OF THE INVENTION

According to the present invention, the quarter-wave layer is formed by electro deposition so that the quarter-wave layer is obtained with a finely adjusted and strictly controlled thickness, whereby resolving the problems of the prior art described hereinbefore.

Figure 1:
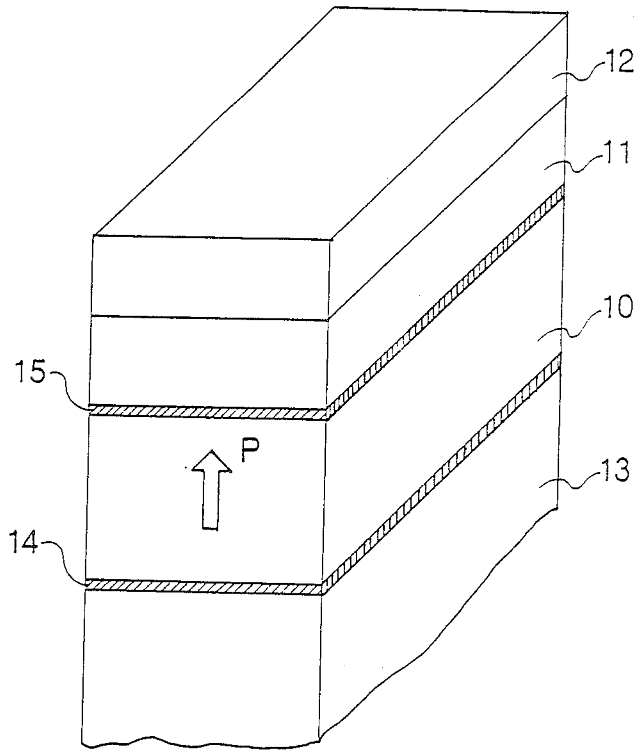
FIGURE 1 PRIOR ART
FIG. 1 is a perspective view showing a piezoelectric transducer of the prior art used as an ultrasonic probe for diagnostic inspection.
Figure 2:
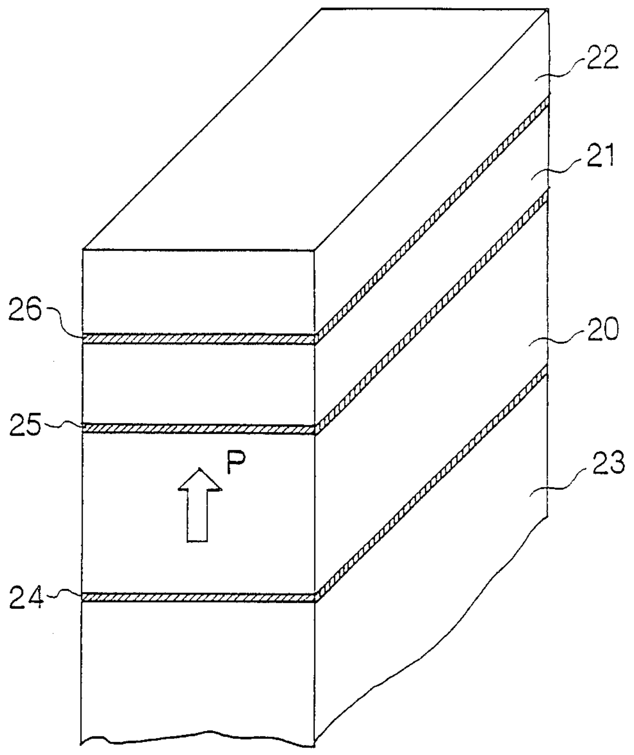
FIGS. 2, 3 and 4 are respectively a perspective view showing a piezoelectric transducer according to the first, second and third embodiment of the present invention.

FIG. 2 is a perspective view showing a piezoelectric transducer according to the first embodiment of the present invention.

The piezoelectric transducer of this embodiment includes a piezoelectric material layer 20 which is processed to be polarized in the thickness direction P shown by an arrow. The piezoelectric material layer 20 of this embodiment is made of a piezoelectric ceramic.

As shown in FIG. 2, electrode layers 24 and 25 are formed on the opposite surfaces of the piezoelectric material layer 20 by means of the burning, sputerring, vapour depositing or plating method. The piezoelectric material layer 20 is to be electricly excited through the electrode layers 24 and 25 to generate an ultrasonic oscillation or receive electric signal due to the acoustic oscillation of the piezoelectric material layer 20.

The piezoelectric transducer of the present embodiment further includes an acoustic matching section composed of quarter-wave layers 21 and 22.

According to the present invention, the quarter-wave layer 21 is formed by electro deposition. In more detail, electric voltage is applied between the electrode layer 25 and an opposite electrode to deposit the layer 21. In this case, the material for the layer 21 is composed of a matrix of an organic resin such as phenolic or epoxy resin and an inorganic powder uniformly dispersed in the matrix. Such an inorganic powder includes, for example, graphite, $TiO_2$, BN, AlN and $Al_2O_3$ podwer.

After a quarter-wave layer 21 is deposited with a predetermined thickness in the state of a viscous fluid, it is perfectly dried to a solid state. Then an electrode layer 26 is formed on the surface of the quarter-wave layer 21 by means of firing vapour depositing, sputtering or plating method. The electric conductive layer 26 may be mae of a metal such as Al, Ni, Ag, Ti, Cr, Cu and Au. Another quarter-wave layer 22 is formed on the surface of the electroce layer 26 by the above-mentioned electro deposition method.

The electric conductive layer 26 may operate as a shielding electrode for shutting external noise which may enter to the piezoelectric material layer 20 from an acoustic load to be inspected, such as a human body, whereby improving the S/N ratio of the piezoelectric transducer. The thickness of the electric conductive layer 26 should be sufficiently small so as not to disturb the function of the quarter-wave layers 21 and 22.

Although the layer 20 of this example is made of a piezoelectric ceramic, it may be made of an organic piezoelectric material such as $PVF_2$.

Figure 3:
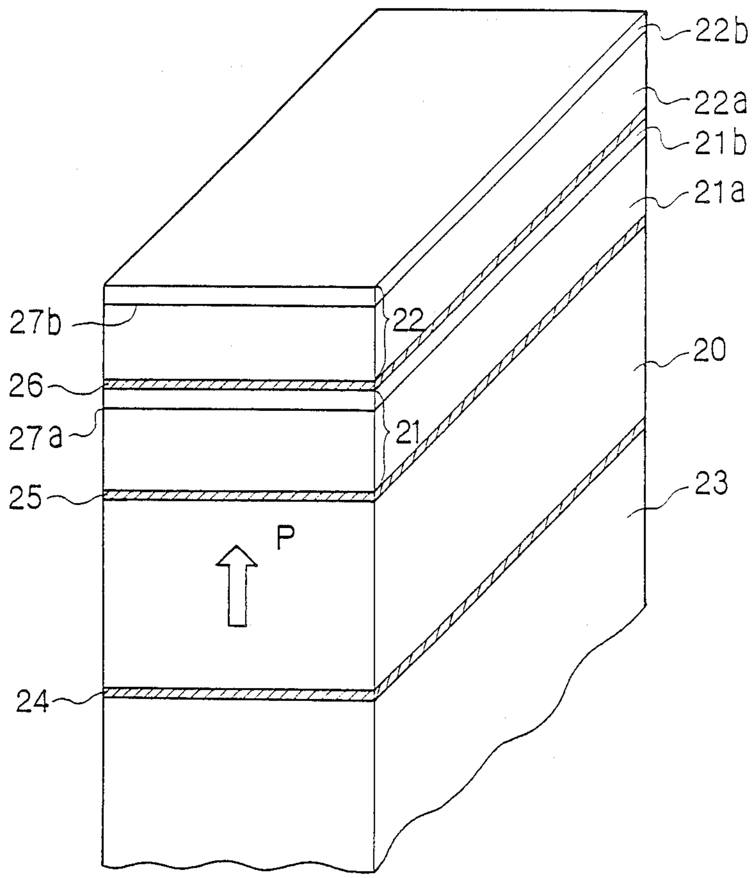

FIG. 3 is a perspective view showing a piezoelectric transducer according to the second embodiment of the present invention.

The piezoelectric transducer of this embodiment includes a piezoelectric material layer 20 formed with a pair of electrode layers 24 and 25 respectively on the opposite surfaces thereof, an acoustic matching section composed of quarter-wave layers 21 and 22, and a backing layer 23 for absorbing the acoustic oscillation.

The quarter-wave layers 21 and 22 contain respectively electric conductive layers *27a* and *27b* therein and are bonded with each other through an electric conductive layer 26. Similar to the first embodiment of the invention, the quarter-wave layer 21 of this embodiment may be made of a composite material composed of a matrix of an organic resin such as phenolic resin or epoxy resin and an inorganic fine powder such as graphite, $TiO_2$, BN, AlN or $Al_2O_3$ powder dispersed in the matrix.

The quarter-wave layer 21 can be prepared as follows:

The above composite material is electro deposited to a certain thickness less than the quarter-wave length on the surface of the electrode layer 25, to thereby form the layer *21a*. Then the obtained layer *21a* is dried. The thickness of the thus obtained layer *21a* is measured accurately.

An electric conductive layer *27a* is then formed with a sufficiently small thickness on the top surface of the layer *21a* by vapour depositing, sputtering or plating a matal such as Al, Ni, Ag or Au thereon.

Then, the electro deposition is conducted with the same composite material as the layer *21a* for an appropriate voltage to thereby form a layer *21b* of a predetermined thickness on the electric conductive layer *27a*.

Usually, it is very difficult even for the skilled operators to obtain an electro-deposited layer of a predetermined thicknness with a single depositing operation. In this embodiment, however, the deposition of the quarter-wave layer 21 is conducted by two operations, so that the total thickness of the quarter-wave layer 21 can be adjusted with a high accuracy.

The electro deposition of the quarter-wave layer may be conducted by the electro painting method or the electrophoretic deposition method.

The electro painting method, which is preferably employed particularly to prepare a quarter-wave layer containing an electric conductive layer therein, will be explained.

The electro painting method is conducted by dipping an object to be treated and an opposite electrode in an aqueous compound and applying electric direct current thereacross to thereby deposit the compound on the object.

Cation electro painting method will be explained in more detail. The aqueous compound used in the cation electro painting method contains a matrix of a water-soluble resin and inorganic particles dispersed uniformly in the matrix. The electro painting method can be conducted without inorganic particles which, however, are preferably employed, since they become filler in the deposited compound layer.

An object to be treated and an opposite electrode are dipped in the aqueous compound. Then, direct current is applied across the object and the opposite electrode by connecting them respectively to the negative pole and the positive pole of a direct current source to thereby cause chemical reaction on the surface on the object so that the resin is deposited on the object together with the filler.

In the cation electro painting method, the amount of the deposited resin and filler is readily controlled by adjusting the time duration and the voltage of the used direct current. Further, it is possible to obtain a deposit free of pinhole.

The deposited layer is then water washed and cured by heating to obtain a uniform deposited layer. The electro painting method includes also anion electro painting which is conducted by connecting the object to the positive pole and the opposite electrode to the negative pole of the direct current source.

First, in the electro painting method, inorganic particles can be dispersed in the organic resin, and the ratio of the inorganic particles to the organic resin can be readily controlled in a relatively wide range. The acoustic impedance density of the deposited layer varies with the amount of the inorganic particles, so that the acoustic impedance density of the deposited layer can be readily changed. It permits preparation of the acoustic matching layer having a predetermined acoustic impedance.

Second, the thickness of the acoustic matching layer can be readily controlled by adjusting the charging time duration of the treatment, voltage or current density of the direct current. Therefore, it is possible to provide a piezoelectric transducer having an acoustic matching layer of a finely adjusted thickness with high accuracy.

Third, in the electrophoretic deposition method and the electro painting method, the deposit is formed steadily as snow fall, so that a relatively thin layer can be readily obtained. Therefore these methods are very suitable for preparation of high-frequency piezoelectric transducer, in which the thickness of the quarter-wave layer is small.

Fourth, the acoustic matching layer obtained by these electro deposition methods do not present pinhole. Even if pinholes are formed during the deposition, the organic resin and the filler are deposited to completely fill the pinholes.

Fifth, by these electro deposition methods, the acoustic matching layers can be formed on the piezoelectric material layer without adhesive.

As described above, in this embodiment, the acoustic matching layer 21*a* is first formed by the electro painting method with a predetermined thickness which is smaller than the quarter-wave length. Then the electrode layer 27*a* is formed and the acoustic matching layer 21*b* is formed by the electro painting method with a thickness so that the total thickness of the acoustic-layers 21*a* and 21*b* is equal to the quarter-wave length.

Next, an electric conductive layer 26 is formed on the surface of the acoustic matching layer 21*b* with a sufficiently small thickness, and an acoustic matching layer 22*a*, an electric conductive layer 27*b* and an acoustic matching layer 22*b* are successively formed in the similar manner as the above. The layers 22*a* and 22*b* which constitute a quarter-wave layer 22 are preferably made of epoxy resin or epoxy resin mixed with a small amount of inorganic powder.

The electric conductive layers 27*a*, 26 and 27*b* can operate as a shielding electrode for shutting the external noise which may enter to the piezoelectric transducer from an acoustic load to be inspected such as a human body. Such a function raises the S/N ratio of the transducer. It is of course that the thickness of the electric conductive layer 27*a*, 26, 27*b* is sufficiently small as compared with those of the matching layers 21*a*, 21*b*, 22*a* and 22*b*, so that the electric conductive layers 27*a*, 26, 27*b* do not disturb the function of the matching layers 21*a*, 21*b*, 22*a* and 22*b*.

The third embodiment of the present invention will be explained with reference to FIG. 4, which is a perspective view of the piezoelectric transducer of this embodiment.

The piezoelectric transducer according to the third embodiment of the present invention includes an acoustic matching section composed of three quarter-wave layers 21, 22 and 30.

The quarter-wave layer 21 which is formed on the top surface of the electrode layer 25 does not contain the electric conductive layer therein. The quarter-wave layer 21 is preferably formed by means of the electrophoretic deposition method which will be explained hereinafter with reference to FIG. 5. The quarter-wave layer 21 is preferably made of a material having an inherent acoustic impedance density of $10\times10^6$ to $15\times10^6$ Kg/m$^2$.sec. such as borosilicate glass or silicate glass.

After the quarter-wave layer 21 is deposited by the electrophoretic deposition method and subjected to a heat treatment to cure the same, a high electric direct current voltage is applied across the piezoelectric material layer 20 to pertain piezoelectric performance thereto.

The quarter-wave layer 22 is composed of acoustic matching layers 22*a* and 22*b* between which an electric conductive 27*b* is formed. The quarter-wave layer 30 is also composed of acoustic matching layers 30*a* and 30*b* between which an electric conductive layer 31*a* is formed. Furthermore, an electric conductive layer 31 is formed at the interface between the quarter-wave layers 22 and 30, that is, between the acoustic matching layers 22*b* and 30*a*.

The acoustic matching layers 22*a* and 22*b* which constitute the quarter-wave layer 22 are preferably made of a material having an inherent acoustic impedance density of $3.0\times10^6$ to $4.5\times10^6$ Kg/m$^2$.sec. such as a composite material containing a matrix of an organic resin, for example, phenolic resin or epoxy resin, and an inorganic powder finely and uniformly dispersed in the matrix. Such an inorganic powder includes graphite, $TiO_2$, BN, AlN or $Al_2O_3$.

The acoustic matching layers 30*a* and 30*b* which constitute the quarter-wave layer 30 are preferably made of a material having an inherent acoustic impedance density of $1.7\times10^6$ to $2.1\times10^6$ Kg/m$^2$.sec. such as urethane resin, epoxy resin and the like.

The electric conductive layers 26, 27*b*, 31 and 31*a* and the acoustic matching layer 22*a*, 22*b*, 30*a* and 30*b* are formed respectively in a similar manner to the electric conductive layers and the acoustic matching layers of the piezoelectric transducer of the second embodiment.

Now, the electrophoretic deposition of the quarter-wave layer 21 will be explained in more detail with reference to FIG. 5.

Figure 5:
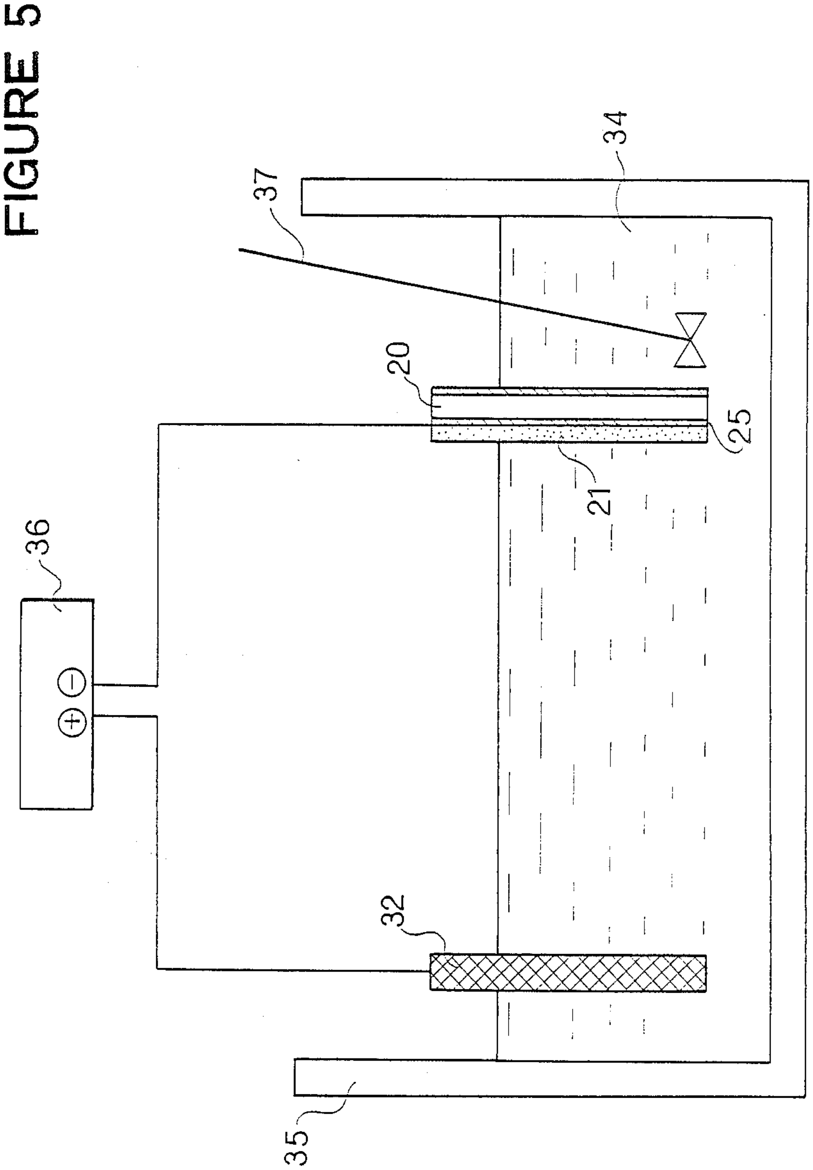
FIG. 5 is a diagramatic view of an apparatus for electrophoretic diposition method.

FIG. 5 shows diagramatically an apparatus for electrophoretic deposition.

The apparatus comprises a bath 35 for containing therein a slurry 34 of a material which is to be electro deposited on the electrode layer 25. The piezoelectric material layer 20 with the electrode layer 25 is dipped in the slurry 34 together with an opposite electrode 32. By connecting the electrode layer 25 and the opposite electrode 32 respectively with the negative pole and the positive pole of a direct current source 36, electric direct current voltage is applied across the electrode layer 25 and the opposite electrode 32 while agitating the slurry 34 by means of a stirrer 37. The particles contained in the slurry 34 is electrostatically charged and then moved to the negatively charged electrode layer 25 so that the quarter-wave layer 21 is deposited thereon with a uniform thickness.

The slurry 34 is prepared, for example, by adding borosilicate glass powder to a mixture of ethyl alcohol, polyvinyl butyral and water and stirring them by a homonizer thoroughly to disperse the glass powder in the mixture.

The thus obtained quarter-wave layer 21 of uniformly deposited glass powder is then subjected to a heat treatment at a temperature between 500° C. and 900° C. to provide acoustic matching properties.

The sonic velocity in glass, particularly borosilicate glass, is twice higher than that in organic resin so that it is easier to control the thickness of the deposited layer by adjusting the time duration and the electric voltage of the direct current in the electrophoretic deposition.

Since the thickness of the glass layer is readily adjusted by griding, the most appropriate thickness of the glass layer can be obtained by the parallel and flat griding.

According to the process of the present invention, it is possible to prepare not only the piezoelectric transducers having a central frequency between 2 MHz and 7.5 MHz, but also ones having a central frequency higher than 10 MHz with a high performance.

Now the present invention will be explained by way of Examples, which should be construed to be illustrative of the invention and not to restrict the scope of the invention in any means.

EXAMPLE 1

In this Example, a piezoelectric transducer shown in FIG. 2 and having a central frequency of 15 MHz was prepared, which was intended for use as an ultrasonic probe for linear array.

Au/Cu electrode layers 24 and 25 were formed by vapour deposition in a thickness of 3000 Å on the opposite surfaces of a piezoelectric ceramic 20 of $PbTiO_3$.

A quarter-wave layer 21 having an inherent acoustic impedance density of $8.5\times10^6$ Kg/m$^2$.sec. was made from a composite material composed of a matrix of epoxy resin and an appropriate amount of $Al_2O_3$ powder having a particle size of 0.5 microns and dispersed uniformly in the matrix.

Au/Ti was vapour deposited in a thickness of 3000 Å on the quarter-wave layer 21 to form an electric conductive layer 26. Then epoxy resin was then electro deposited on the electric conductive layer 26 to form a quarter-wave layer 22 having an inherent acoustic impedance density of $2.4\times10^6$ Kg/m$^2$.sec.

The thickness of the quarter-wave layers 21 and 22 was controlled to be one quarter of the wavelength of the foundamental consonant frequency of the piezoelectric material layer 20. In this Example, the quarter-wave layer 21 presented a thickness of 52 microns and the layer 22 presented 45 microns.

The thus obtained piezoelectric transducer was tested as an ultrasonic probe for medical diagnosis by employing a gelatinous material having an inherent acoustic impedance density and an ultrasonic attenuation coefficient similar to those of the human body. The piezoelectric transducer was found to have a resolution power of 0.5 mm and a high S/N ratio.

EXAMPLE 2

In this Example, a piezoelectric transducer shown in FIG. 3 and having a central frequency of 15 MHz was prepared, which was intended for use as an ultrasonic probe for linear array.

Au/Cr electrode layers 24 and 25 were formed by vapour deposition respectively in a thickness of 3000 Å on the opposite surfaces of a piezoelectric ceramic 20 of $PbTiO_3$.

An acoustic matching layer **21*a*** having an inherent acoustic impedance density of $8.3\times10^6$ Kg/m$^2$.sec. was made from a composite material composed of a matrix of epoxy resin and an appropriate amount of $Al_2O_3$ powder having a particle size of 0.5 microns and dispersed uniformly in the matrix.

After having cured the acoustic matching layer **21*a*, Al was vapour deposited in a thickness of 2000 Å on the layer 21*a* to form an electric conductive layer 27*a*. The thickness of the acoustic matching layer 21*a* was measured to be 92% of the quarter-wave length at the consonant frequency of 15 MHz. Thus, an acoustic matching layer 21*b* was formed in the remaining thickness of 8% with the same composite material as the layer 21*a***.

Next, Al was vapour deposited in a thickness of 2000 Å on the top surface of the layer **21*b* to form an electric conductive layer 26. Then, acoustic matching layers 22*a* and 22*b* of epoxy resin having an acoustic impedance density of $2.4\times10^6$ Kg/m$^2$.sec. and an electric conductive layer 26 of Al were formed in a similar manner as the above. Similarly, the total thickness of the acoustic matching layers 22*a* and 22*b* was controlled to be the quarter-wave length corresponding to the consonant frequency of the piezoelectric material layer 20. The total thickness of the layers 21*a* and 21*b* and that of the layers 22*a* and 22*b*** were respectively 51 microns and 45 microns.

The thus obtained piezoelectric transducer was tested as an ultrasonic probe for medical diagnosis by employing a gelatinous material having an inherent acoustic impedance density and an ultrasonic attenuation coefficient similar to those of the human body. The piezoelectric transducer was found to have a resolution power of 0.5 mm and a high S/N ratio.

EXAMPLE 3

Figure 6:
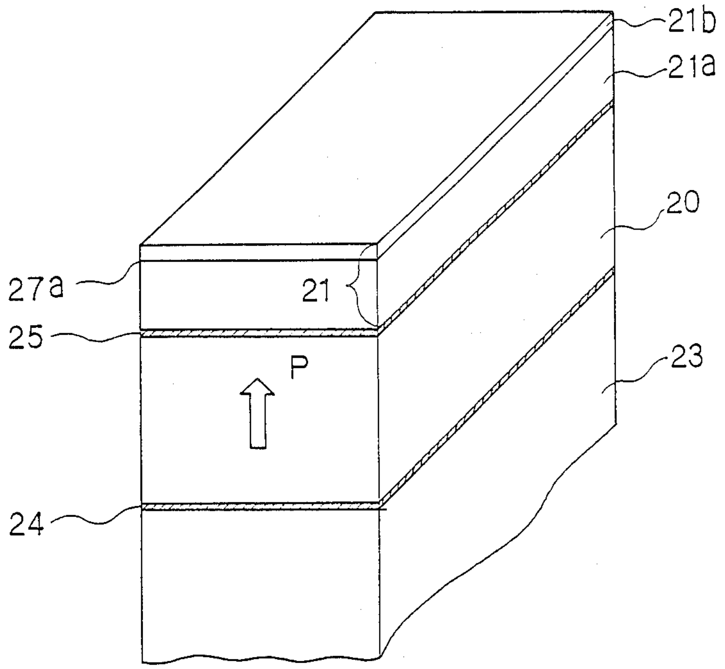
FIG. 6 is a perspective view showing a piezoelectric transducer prepared in the example of the present invention.

In this Example, a piezoelectric transducer shown in FIG. 6 and having a central frequency of 15 MHz was prepared, for use as an ultrasonic probe for linear array. As shown in FIG. 6 the piezoelectric transducer of this example is of the single quarter-wave matched type.

Cr/Au was vapour deposited in a thickness of 3000 Å respectively on the opposite surfaces of a piezoelectric ceramic 2 of $PbTiO_3$ to form electrode layers 24 and 25.

A compound of epoxy resin containing an appropriate amount of AlN powder of 0.5 microns was deposited by the electro painting method to form an acoustic matching layer **21*a* having an acoustic impedance density of $4.5\times10^6$ Kg/m$^2$.sec. Al was vapour deposited on the surface of the acoustic matching layer 21*a* in a thickness of 2000 Å to form an electric conductive layer 27*a*. Then, an acoustic matching layer 21*b* was formed by the electro painting method by employing the same compound as the layer 21a. The total thickness of the acoustic matching layers 21a and 21b** was found to be just the quarter-wave length, that is, 55 microns.

The thus prepared ultrasonic probe presented a normalized bandwidth of about 50%. The probe was tested in the similar manner as Example 2. Although the ultrasonic probe of this example was of single quarter-wave matched type, it was found to have a resolution power of 0.5 mm and a high S/N ratio.

EXAMPLE 4

Figure 4:
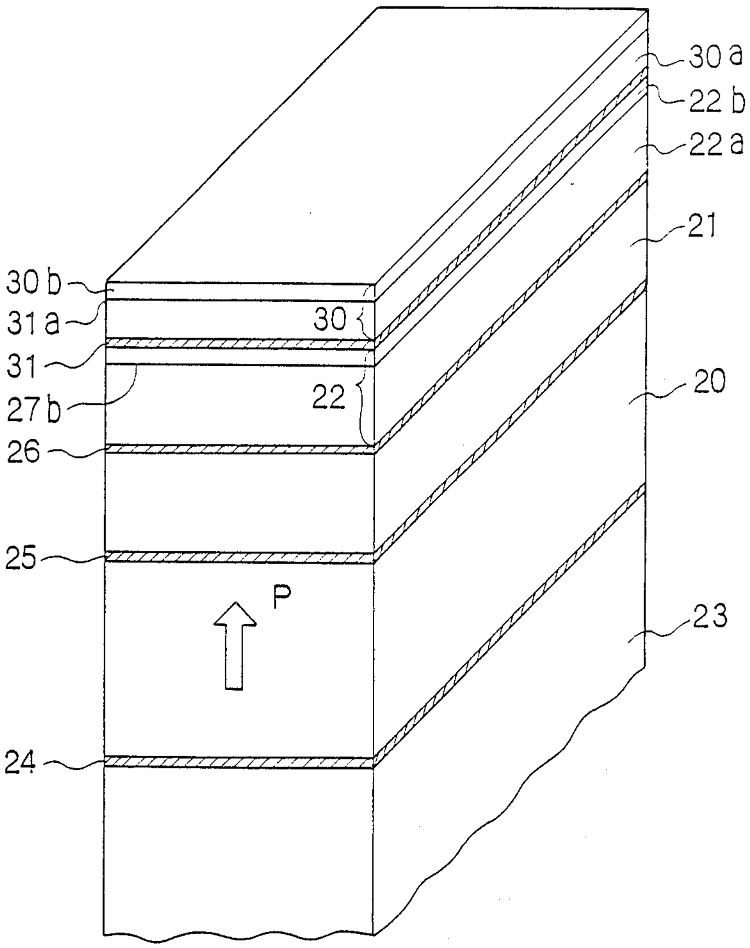

In this Example, a piezoelectric transducer shown in FIG. 4 and having a central frequency of 15 MHz was prepared, which was intended for use as an ultrasonic probe for linear array.

Au/Cu electrode layers 24 and 25 were formed by vapour deposition in a thickness of 3000 Å on the opposite surfaces of a piezoelectric ceramic 20 of $PbTiO_3$.

Borosilicate glass powder was uniformly deposited by the electrophoretic method on the electrode layer 25, and the deposited layer was heat treated for 10 minutes at 800° to form a quater-wave layer 21. The acoustic impedance density of the layer 21 was found to be $13.8\times10^6$ Kg/m$^2$.sec.

After the piezoelectric ceramic 20 was subjected to polarization treatment, Al was vapour deposited on the surface of the quater-wave layer 21 to form an electric conductive layer 26 having a thickness of 2000 Å. Further, an acoustic matching layer 22a having an acoustic impedance density of $4.1\times10^6$ Kg/m$^2$.sec. was formed by the electro painting method. After the acoustic matching layer 22a was cured by heating the same at 150° C. for 2 hours, Al was vapour deposited in a thickness of 2000 Å to form an electric conductive layer 27b, and an acoustic matching layer 22b was formed by the same material as the acoustic matching layer 22a. Since the thickness of the acoustic matching layer 22a was found to be 92% of the quarter-wave length at the consonant frequency of 15 MHz, the acoustic matching layer 22b was formed to have a thickness of remaining 8% of the quarter-wave length. In this example, the acoustic matching layers 22a and 22b were prepared from a compound composed of a matrix of epoxy resin and an appropriate amount of $Al_2O_3$ powder having a particle size of 0.5 microns and dispersed uniformly in the matrix.

An electric conductive layer 31 of Al was formed by vapour deposition in a thickness of 2000 Å on the surface of the acoustic matching layer 22b. Further, acoustic matching layers 31a and 31b each having an acoustic impedance density of $1.95\times10^6$ Kg/m$^2$.sec. were formed by the electro painting method, and an electric conductive layer 31a of Al was formed between the acoustic matching layers 31a and 31b. The total thickness of the acoustic matching layers 31a and 31b was controlled to be one quarter of the wavelength at the consonant frequency of 15 MHz.

The thickness of the quarter-wave layer 22 composed of the acoustic matching layers 22a and 22b was found to be 48 microns, while the thickness of the quarter-wave layer 31 composed of the acoustic matching layers 31a and 31b was found to be 33 microns.

The thus prepared ultrasonic probe was found to present a normalized bandwidth of 90% with respect to water load and a ripple in the passband of lower than 1.5 dB.

The obtained piezoelectric transducer was further tested as an ultrasonic probe for medical diagnosis by employing a gelatinous material having an inherent acoustic impedance density and an ultrasonic attenuation coefficient similar to those of the human body. The piezoelectric transducer was evaluated to have a resolution power of 0.5 mm and a good S/N ratio.

We claim:

1. Process for preparation of a piezoelectric transducer comprising the steps of;

forming electrode layers on the opposite surfaces of a piezoelectric material element; and forming an acoustic matching section on one surface of the electrode layer, said acoustic matching layer consisting of at least on quarter-wavelength layer, said processor being characterized in that the acoustic matching section is formed by:

forming on a surface of one of the electrode layers by electrodeposition a first acoustic matching layer having a thickness smaller than a quarter-wavelength at the consonant frequency of the piezoelectric transducer;

forming an electric conductive layer on the surface of the first acoustic matching layer; and forming on the electric conductive layer by electrodeposition a second acoustic matching layer having a thickness smaller than that of the first matching layer but corresponding to the remaining length of said quarter-wavelength so that the total thickness of the first and second acoustic matching layers is equal to said quarter-wavelength.

2. Process for preparation of a piezoelectric transducer as claimed in claim 1, wherein the electro deposition is conducted by an electro painting method.

3. Process for preparation of a piezoelectric transducer as claimed in claim 1, wherein the electro deposition is conducted by an electrophoretic method.

4. Process for preparation of a piezoelectric transducer as claimed in claim 1, wherein the electric conductive layer is formed on the surface of the first acoustic matching layer after the first acoustic matching layer formed by the electrodeposition is hardened.

5. Process for preparation of a piezoelectric transducer as claimed in claim 1, wherein the acoustic matching section is formed by the steps of:

forming a quarter-wave layer having an acoustic impedance density;

forming an electric conductive layer on the surface of the quarter-wave layer; and forming on the thus formed electric conductive layer another quarter-wave layer having an acoustic impedance density which is different from that of the first mentioned quarter-wave layer.

6. Process for preparation of a piezoelectric transducer as claimed in claim 1, the acoustic matching section is formed by electrodepositing two quarter-wave layers having respectively an acoustic impedance density of $8.0\times10^6$ to $10.0\times10^6$ kg/m$^2$.sec. and $2.0\times10^6$ to $3.0\times10^6$ kg/m$^2$.sec.

7. Process for preparation of a piezoelectric transducer as claimed in claim 6, wherein the quarter-wave layer having an acoustic impedance density of $8.0\times10^6$ to $10.0\times10^6$ kg/m$^2$.sec. is formed by electrodepositing a compound containing a matrix of an organic resin and an inorganic powder dispersed in the matrix.

8. Process for preparation of a piezoelectric transducer as claimed in claim 7, wherein the organic resin matrix includes at least one selected from the group consisting of acrylic resin, phenolic resin and epoxy resin.

9. Process for preparation of a piezoelectric transducer as claimed in claim 8, wherein the inorganic powder includes the powder of at least one selected from the group consisting of graphite, $TiO_2$, BN, AlN, and $Al_2O_3$.

10. Process for preparation of a piezoelectric transducer as claimed in claim 8, wherein the quarter-wave layer having an acoustic impedance density of $2.0 \times 10^6$ to $3.0 \times 10^6$ kg/m$^2$.sec. is made of a compound containing a matrix of an organic resin and an inorganic powder dispersed in the matrix.

11. Process for preparation of a piezoelectric transducer as claimed in claim 10, wherein the organic resin matrix includes at least one selected from the group consisting of acrylic resin, phenolic resin and epoxy resin.

12. Process for preparation of a piezoelectric transducer as claimed in claim 11, wherein the inorganic powder includes the powder of at least one selected from the group consisting of graphite, $TiO_2$, BN, AlN, and $Al_2O_3$.

13. Process for preparation of a piezoelectric transducer as claimed in claim 1, wherein the electrode layer is formed by one method selected from the group consisting of firing, vapour deposition, sputtering and plating.

14. Process for preparation of a piezoelectric transducer as claimed in claim 13, wherein the electrode layer is made of a metal or an alloy containing at least one selected from the group consisting of Al, Ni, Ti, Cr, Cu, Ag and Au.

15. Process for preparation of a piezoelectric transducer as claimed in claim 11, wherein the acoustic matching section is formed by electrodepositing three quarter-wave layers having respectively an acoustic impedance density of $10 \times 10^6$ to $15 \times 10^6$ kg/m$^2$.sec., $3.0 \times 10^6$ to $4.5 \times 10^6$ kg/m$^2$.sec. and $1.7 \times 10^6$ to $2.1 \times 10^6$ kg/m$^2$.sec.

16. Process for preparation of a piezoelectric transducer as claimed in claim 15, wherein the quarter-wave layer having an acoustic impedance density of $1.7 \times 10^6$ to $2.1 \times 10^6$ kg/m$^2$.sec. is formed by electrodepositing one member selected from the group consisting of urethane resin and epoxy resin.

17. Process for preparation of a piezoelectric transducer as claimed in claim 15, wherein the quarter-wave layer having an acoustic impedance density of $1.7 \times 10^6$ to $2.1 \times 10^6$ kg/m$^2$.sec. is formed by an electro painting method.

18. Process for preparation of a piezoelectric transducer as claimed in claim 15, wherein the electrode layer is formed by one method selected from the group consisting of firing, vapour deposition, sputtering and plating.

19. Process for preparation of a piezoelectric transducer as claimed in claim 18, wherein the electrode layer is made of a metal or an alloy containing at least one selected from the group consisting of Al, Ni, Ti, Cr, Cu, Ag and Au.

20. Process for preparation of a piezoelectric transducer as claimed in claim 15, wherein the quarter-wave layer having an acoustic impedance density of $10 \times 10^6$ to $15 \times 10^6$ kg/m$^2$.sec. is made of a member selected from the group consisting silicate glass, borosilicate glass and chalcogenide glass.

21. Process for preparation of a piezoelectric transducer as claimed in claim 20, wherein the quarter-wave layer having an acoustic impedance density of $10 \times 10^6$ to $15 \times 10^6$ kg/m$^2$.sec. is formed by an electrophoretic deposition method.

22. Process for preparation of a piezoelectric transducer as claimed in claim 21, wherein the quarter-wave layer having an acoustic impedance density of $3.0 \times 10^6$ to $4.5 \times 10^6$ kg/m$^2$.sec. is formed by electrodepositing a compound containing a matrix of an organic resin and an inorganic powder dispersed in the matrix.

23. Process for preparation of a piezoelectric transducer as claimed in claim 23, wherein the organic resin matrix includes at least one selected from the group consisting of acrylic resin, phenolic resin and epoxy resin.

24. Process for preparation of a piezoelectric transducer as claimed in claim 23, wherein the inorganic powder includes the powder of at least one selected from the group consisting of graphite, $TiO_2$, BN, AlN, and $Al_2O_3$.

25. Process for preparation of a piezoelectric transducer as claimed in claim 22, wherein the quarter-wave layer having an acoustic impedance density of $3.0 \times 10^6$ to $4.5 \times 10^6$ kg/m$^2$.sec. is formed by an electro painting method.

26. Process for preparation of a piezoelectric transducer comprising the steps of:

forming electrode layers on the opposite surfaces of a piezoelectric material element; and forming an acoustic matching section on one surface of the electrode layer, said acoustic matching layer consisting of at least two quarter-wavelength layers, said process being characterized in that the acoustic matching section is formed by:

forming on a surface of one of the electrode layers by electrodeposition a first acoustic matching layer of a first organic resin based matrix material having a thickness smaller than a quarter-wavelength at the consonant frequency of the piezoelectric transducer;

forming a first electric conductive layer on the surface of the first acoustic matching layer;

forming on the first electric conductive layer by electrodeposition a second acoustic matching layer of the first material having a thickness smaller than that of the first matching layer but corresponding to the remaining length of said quarter-wavelength so that the total thickness of said first and second acoustic matching layers is equal to said quarter-wavelength, whereby said first and second acoustic matching layers form a first quarter-wavelength layer, forming a second electric conductive layer on a surface of the second acoustic matching layer, forming on a surface of the second electric conductive layer by electrodeposition a third acoustic matching layer of a second organic resin based matrix material having an acoustic impedance density smaller than that of the first material and having a thickness smaller than a quarter-wavelength at the consonant frequency of the piezoelectric transducer;

forming a third electric conductive layer on the surface of said third acoustic matching layer; and forming on a surface of said third electric conductive layer by electrodeposition a fourth acoustic matching layer of said second material having a thickness smaller than that of said third matching layer but corresponding to the remaining length of said quarter-wavelength so that the total thickness of said third and fourth acoustic matching layers is equal to said quarter-wavelength, whereby said third and fourth acoustic matching layers form a second quarter-wavelength layer.

27. Process for preparation of a piezoelectric transducer claimed in claim 26 wherein each of said first and third acoustic matching layers has a thickness corresponding to a substantial portion of said quarter-wavelength.

28. Process for preparation of a piezoelectric transducer comprising the steps of:

forming electrode layers on the opposite surfaces of a piezoelectric material element; and forming an acoustic matching section on one surface of the electrode layers, said acoustic matching section consisting of three quarter-wavelength layers, said process being characterized in that the acoustic matching section is formed by:

forming on a surface of one of the electrode layers by electrodeposition a first acoustic matching layer of an inorganic material having a thickness substantially equal to a quarter-wavelength at the consonant frequency of the piezoelectric transducer so as to form a first quarter-wavelength layer, forming a first electric conductive layer on the surface of said first acoustic matching layer;

forming on a surface of said first electric conductive layer by electrodeposition a second acoustic matching layer of a first organic resin based matrix material having an acoustic impedance density smaller than that of said inorganic material and having a thickness smaller than said quarter-wavelength at the consonant frequency of the piezoelectric transducer;

forming a second electric conductive layer on the surface of said second acoustic matching layer;

forming on said second electric conductive layer by electrodeposition a third acoustic matching layer of said first matrix material having a thickness smaller than that of said second matching layer but corresponding in thickness to the remaining length of said quarter-wavelength so that the total thickness of said second and third acoustic matching layers is equal to said quarter-wavelength, whereby the second and third acoustic matching layers form a second quarter-wavelength layer, forming a third electric conductive layer on a surface of said third acoustic matching layer, forming on a surface of said third electric conductive layer by electrodeposition a fourth acoustic matching layer of a second organic resin based matrix material having an acoustic impedance density smaller than that of said first matrix material and having a thickness smaller than said quarter-wavelength at the consonant frequency of the piezoelectric transducer;

forming a fourth electric conductive layer on a surface of said fourth acoustic matching layer; and forming on a surface of said fourth electric conductive layer by electrodeposition a fifth acoustic matching layer of said second matrix material having a thickness smaller than that of said fourth matching layer but corresponding to the remaining length of said quarter-wavelength so that the total thickness of said fourth and fifth acoustic matching layers is equal to said quarter-wavelength, whereby said forth and fifth acoustic matching layers form a third quarter-wave layer.

29. Process for preparation of a piezoelectric transducer claimed in claim 28 wherein each of said second and fourth acoustic matching layers has a thickness corresponding to a substantial portion of the quarter-wavelength.

* * * * *

UNITED STATES PATENT AND TRADEMARK OFFICE
CERTIFICATE OF CORRECTION

PATENT NO. : 4,756,808

DATED : July 12, 1988

INVENTOR(S) : Kazuaki Utsumi et al.

It is certified that error appears in the above-identified patent and that said Letters Patent is hereby corrected as shown below:

| | |
|---|---|
| COLUMN 1, LINE 45 | Delete "enery" insert --energy--; |
| COLUMN 4, LINE 8 | Delete "burnig" insert --burning--; |
| COLUMN 5, LINE 50 | Delete "podwer" insert --powder--; |
| COLUMN 5, LINE 55 | Delete "firing" insert --burning--; |
| COLUMN 5, LINE 59 | Delete "electroce" insert --electrode--; |
| COLUMN 6, LINE 34 | Delete "matal" insert --metal--; |
| COLUMN 9, LINE 63 | Delete "foundamental" insert --fundamental--; |
| COLUMN 11, LINE 22 | Delete "quater" insert --quarter--; |
| COLUMN 11, LINE 27 | Delete "quater" insert --quarter--; |
| COLUMN 13, LINE 33 | Delete "11" and insert -- 1 --; |
| COLUMN 14, LINE 10 | Delete "23" insert -- 22 --. |

Signed and Sealed this

Twenty-ninth Day of August, 1989

*Attest:*

DONALD J. QUIGG

*Attesting Officer*

*Commissioner of Patents and Trademarks*